United States Patent [19]
Ohuchi et al.

[11] Patent Number: 5,917,223
[45] Date of Patent: Jun. 29, 1999

[54] SEMICONDUCTOR DEVICE HAVING SALICIDE LAYER

[75] Inventors: Kazuya Ohuchi; Hideki Shibata, both of Kanagawa-ken, Japan

[73] Assignee: Kabushiki Kaisha Toshiba, Tokyo, Japan

[21] Appl. No.: 08/760,025

[22] Filed: Dec. 4, 1996

[30] Foreign Application Priority Data

Dec. 4, 1995 [JP] Japan .................................. 7-315435

[51] Int. Cl.$^6$ ............................ H01L 29/78; H01L 29/45
[52] U.S. Cl. .................... 257/384; 257/377; 257/382; 257/413; 257/576
[58] Field of Search ................................ 257/377, 382, 257/384, 413, 576

[56] References Cited

U.S. PATENT DOCUMENTS

| | | | |
|---|---|---|---|
| 4,738,624 | 4/1988 | Iyer et al. ................................ | 438/67 |
| 4,835,112 | 5/1989 | Pfiester et al. .......................... | 438/24 |
| 4,949,136 | 8/1990 | Jain ........................................ | 257/377 |
| 5,144,408 | 9/1992 | Iwasaki .................................. | 257/576 |
| 5,221,853 | 6/1993 | Joshi et al. ............................. | 257/413 |
| 5,280,190 | 1/1994 | Lu .......................................... | 257/576 |
| 5,444,282 | 8/1995 | Yamaguchi et al. ................... | 257/382 |
| 5,536,684 | 7/1996 | Dass et al. ............................. | 438/201 |
| 5,648,673 | 7/1997 | Yasuda .................................. | 257/377 |

*Primary Examiner*—Jerome Jackson, Jr.
*Attorney, Agent, or Firm*—Loeb & Loeb LLP

[57] ABSTRACT

A semiconductor device has a metal silicide on silicon conductor formed using a salicide process. The metal silicide layer of the conductor includes boron which improves the morphology and conductivity of the metal silicide layer. Implanting boron into the metal silicide layer or the metal to be silicided prevents the metal silicide from aggregating during a subsequent annealing or other heating process. This process allows narrower conductors to be formed without undesirable increases in the resistance of the metal silicide layer. The boron incorporating salicide process is compatible with CMOS processes.

7 Claims, 8 Drawing Sheets

|  | NMOS FET | PMOS FET |
| --- | --- | --- |
| DIFFUSED LAYER | AS 60KeV $3 \times 10^{15}$ cm$^{-2}$ | BF$_2$ 40KeV $5 \times 10^{15}$ cm$^{-2}$ |
| THICKNESS OF Ti LAYER | 30nm | |
| BOLON IMPLANT CONDITION | 10 KeV $2 \times 10^{15}$ cm$^{-2}$ | |

SEMICONDUCTOR DEVICE HAVING SALICIDE LAYER

FIELD OF THE INVENTION

The present invention relates to a salicide (Self Aligned Silicide) layer of CMOSFET and a method of manufacturing the same.

BACKGROUND OF THE INVENTION

In the manufacture of CMOS (complementary insulation gate type) integrated circuits, more concretely in the formation of CMOS-FET (electric field effect transistor) on the semiconductor substrate, it is indispensable to form an extremely thin diffused layer of a source region and a drain region of FET in order to restrict short channel effect that will become conspicuous along with microstructure for high integration and high speed. As a consequence, the diffused layer of the source region and the drain region becomes highly resistant, causing the deterioration in transistor driving power and the increase of delay time.

To solve the above problems, technologies to make the diffused layer resistance low by forming a metallic layer on the diffused layer of the source region and the drain region have been proposed heretofore, one of which is so called Salicide process.

One example of Salicide process is explained hereinafter in reference to FIGS. 1(a) and (b).

In FIG. 1(a), a separation region 51 is formed on a semiconductor substrate 50, and a gate electrode 53 (generally polysilicon) is formed via a gate insulating film 52 on the partial surface of the element region separated by the above separation region 51, and further nitrided silicon (SiN) 54 film is formed on a side-wall insulation layer of the above gate electrode 53.

In the next place, a diffused layer 55 of source region and drain region is formed by the ion implantation method well known to those skilled in the art, a Ti target is sputtered by use of Ar plasma, thereby Ti film 56 is accumulated.

Further, a cap film comprising nitrided titanium (TiN) film 57 is formed so as to restrict the roughness of titanium silicide surface at the formation of titanium silicide described later. At this moment, normally, titanium target is sputtered by use of plasma of mixture gas of argon and nitrogen, thereby nitriding reaction of titanium is induced on the titanium-target surface, and TiN film 57 is accumulated on the abovementioned Ti film 56.

Heat treatment is carried out on the multi layer film formed as shown above, under nitrogenous atmosphere, and as shown in FIG. 1(b), titanium silicide ($TiSi_2$) film 58a and 58b are formed by solid phase reaction of titanium in the TiN film 56 and silicon in the diffused layer 55 and silicon in the gate electrode 53. Then TiN film 57 and unreacted Ti film 56 are removed by etching by use of mixture solution of sulfuric acid and hydrogen peroxide.

According to the above process, self aligned metal layers, i.e., $TiSi_2$ film 58a and 58b can be formed only on the diffused layer 55 and the gate electrode 53. By the way, after this, insulating film is accumulated on the whole surface, a contact ball is formed, and wiring line is arranged so as to connect $TiSi_2$ films 58a and 58b.

$TiSi_2$ films 58a and 58b formed in the above manner reduce the sheet resistance at the region of the diffused layer 55 and the gate electrode 53, for example, the formation of $TiSi_2$ film 58a with film thickness 80 nm reduces the sheet resistance of the diffused layer 55 with junction depth 250 nm from 50 $\Omega/\square$ to 3 $\Omega/\square$.

On the other hand, in the silicon MOSFET as mentioned above, it is indispensable to form an extremely thin diffused layer of a source region and a drain region in order to restrict short channel affect that will become conspicuous along with microstructure for high integration and high speed. As a result, there is a tendency where the clearance between the interface of PN junction of the diffused layer 55 and the interface of substrate silicon of $TiSi_2$ film 58a will become small. And it has been found that the small clearance causes the junction leak current of PN juncton of the diffused layer 55 to become conspicuous.

To avoid this phenomenon, it has become necessary to make thin film thickness of $TiSi_2$ film 58a as well as the depth of the diffused layer in accordance with Scale rule, further, it has become necessary make a thin width of the source region and the drain region-electrode in accordance with scale rule from the viewpoint of reduction of junction capacity.

However, in the case using the thin silicide film as mentioned above, it has been found that there will be the following problems (1) and (2), becoming large factors to prevent microstructure that is indispensable for high integration and high speed of elements.

(1) The rise of the specific resistance of $TiSi_2$ itself was observed by making the $TiSi_2$ film thin. In concrete, it was found that when $TiSi_2$ 58a was formed in thickness 55 nm on the diffused layer 55 with as rather shallow a juncton depth as 180 nm, and than formed by Rapid Thermal Annealing (RTA) for 30 seconds at 750° C. and for 30 seconds at 850° C., the specific resistance of $TiSi_2$ 58a showing 13 $\mu\Omega$cm increased by 30% in bulk $TiSi_2$, becoming a large factor to prevent the realization of microstructure of elements. This phenomenon becomes more conspicuous as $TiSi_2$ film is made thinner, for instance, in the case when $TiSi_2$ 58a with film thickness 30 nm is formed on the diffused layer 55 with as rather shallow a juncton depth as 180 nm, the specific resistance increases by about 100%. The above is a problem owing to the reduction of $TiSi_2$ in its film thickness direction.

(2) It has been found that the electrode sheet resistance increases abnormally as FET is made into microstructure in accordance with scale rule and the width of gate and source and drain electrode becomes narrow. For instance, in the case when $TiSi_2$ 58a with film thickness 55 nm is attached to source and drain electrode with thickness lam, the sheet resistance appears 3 $\Omega/\square$, while in the when $TiSi_2$ 58a with film thickness 55 nm is attached to source and drain electrode with thickness 1 $\mu$m, the sheet resistance becomes 12 $\Omega/\square$.

And the increase of the sheet resistance of $TiSi_2$ in such a micro fine shape becomes more conspicuous as the thickness of $TiSi_2$ gets thinner, for instance, when the thickness of $TiSi_2$ 58a is 30 nm, the sheet resistance of source and drain electrode of 2 $\mu$m is 40 $\Omega/\square$, while the sheet resistance becomes 2 $\Omega/\square$ in source and drain electrode of 5 $\mu$m.

The main possible cause for the increase in resistance mentioned above may be understood as shown below. In the case where the region of the reaction portion between titanium in Ti film 56 and silicon in the diffused layer 55 is a micro fine shape, the contribution of the surface to unit mass naturally increases, and interface energy affects largely upon mophology, i.e., $TiSi_2$ will easily aggregate in order to reduce interface energy.

As a result, for example, as shown in FIG. 2, $TiSi_2$ 58a in the diffused layer 55 becomes partially thinner or gets into island shape, therefore, it has been impossible to realize desired low resistance.

As mentioned heretofore, in the formation of CMOSFET in prior art, there has been a problem that when salicide process was adopted to make electrode portion react with transition metal and make it into metal with low resistance in order to prevent the increase of incidental resistance accompanying with microstructure, if the region of the reaction portion was of a micro fine shape, transition metal chemical aggregated owing to heat process and resistance increased, therefore, it was impossible to realize a desired low resistance.

The above discussion is also true of the silicide process adopted to make the resistance of bipolar base electrode low.

SUMMARY OF THE INVENTION

Accordingly, it is an object of the present invention to provide a semiconductor device and a method of manufacturing the same that enable to prevent transition metal chemical from aggregating owing to heat process and resistance from increasing even if the region of reaction portion is of a micro fine shape in the case to apply salicide process to the formation of CMOSFET gate electrode, source and drain electrode, or bipolar base electrode.

To achieve the above object, the present invention provides a semiconductor device which comprises a semiconductor substrate, and a salicide (Self Aligned Silicide) layer on the semiconductor substrate, including boron so,that a morphology of a surface of the salicide layer is improved.

The present invention also provides a method of manufacturing the semiconductor device which comprises the steps of preparing a semiconductor substrate, forming a metal layer on the semiconductor substrate, forming a metal silicide on a surface of the semiconductor substrate, by a reaction on the semiconductor substrate and the metal layer, and implanting boron so that a concentration of the boron included in the metal silicide is $1 \times 10^{19}$ cm$^{-3}$.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

A more complete appreciation of the present invention and many of its attendant advantages will be readily obtained by reference to the following detailed description considered in connection with the accompanying drawings, in which.

DETAILED DESCRIPTION OF PREFERRED EMBODIMENTS

Embodiments of the present invention will be described in detail with reference to the drawings.

Embodiment 1

Figure 1A:
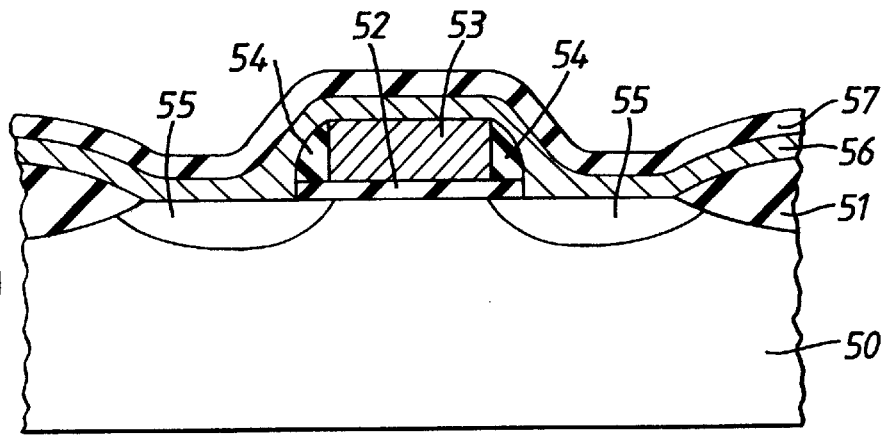
FIGS. 1(a), 1(b) are cross sectional diagram showing an example of MOSFET forming process by applying one example of the conventional salicide process.
Figure 1B:
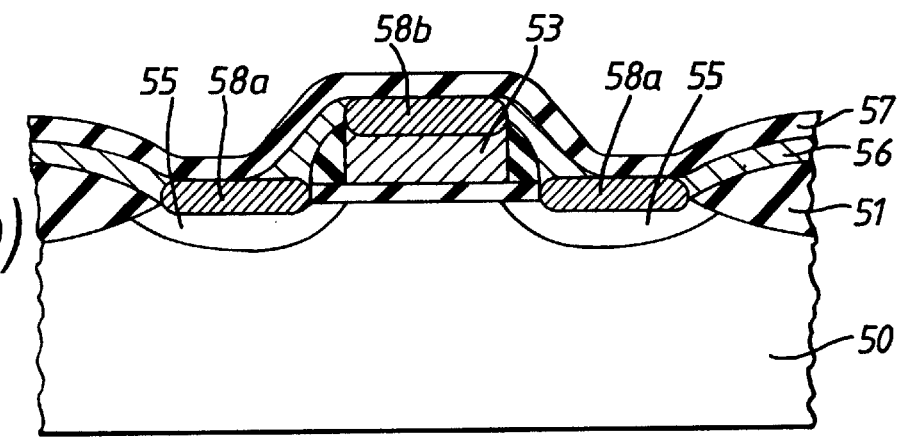
Figure 2:
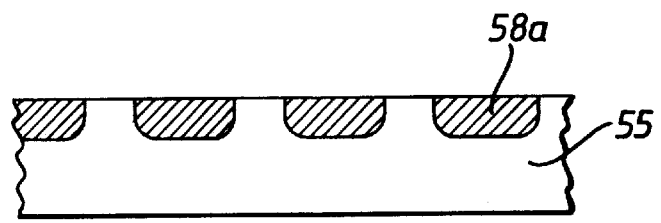
FIG. 2 is a cross sectional diagram showing an example where TiSi$_2$ becomes partially thinner or gets into island shape in the case where the region of the reaction portion between titanium in metal titanium film and silicon in diffused layer is a micro fine shape.
Figure 3A:
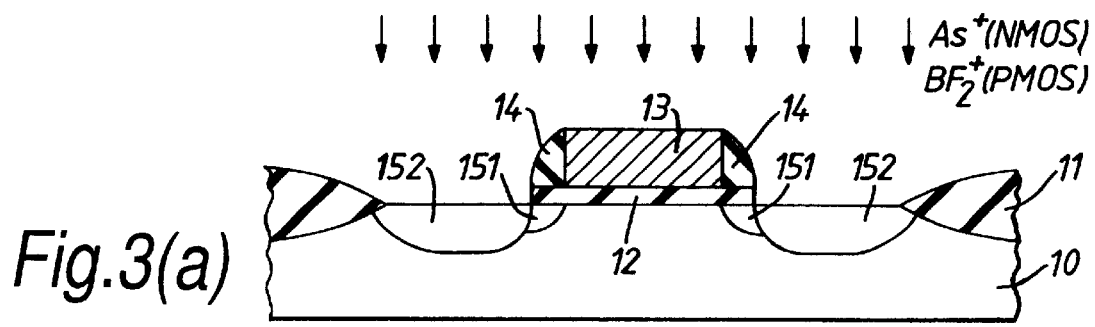
FIGS. 3(a)–3(d) are cross sectional diagrams showing an example of the process regarding an Embodiment 1.

FIGS. 3(a) throughout (d) are schematic diagrams showing a process flow using salicide process in the formation of CMOSFET regarding an embodiment of the manufacturing method of a semiconductor device according to the present invention. And FIG. 4 shows an example of the condition setting in the process shown in FIG. 3.

In the first place, as shown in FIG. 3(a), a separation region 11 is formed on a semiconductor substrate 10, and a gate electrode 13 (generally, non-dope polysilicon) is formed via a gate insulating film 12 on the partial surface of the element region.

In the next place, by the ion implantation method well known to those skilled in the art, As$^+$ ion is implemented into the region of NMOSFET under the conditions 30 KeV, $1 \times 10^{14}$ cm$^{-2}$, while BF$_2^+$ ion is implanted into the region of PMOSFET under the conditions 20 KeV, $1 \times 10^{14}$ cm$^{-2}$, thereby impurities are added to gate electrode 13 and impurity diffused region for source region and drain region is formed on substrate surface portion in self aligned manner.

Then, in order to prevent short-circuit between the source-region and the drain region and the gate electrode 13, a side-wall insulating layer 14 is formed on the side surface of the gate electrode by use of the known technology. Namely, the side-wall insulating layer 14 is formed by dry etching without using mask after accumulation of an insulating layer that does not react in the silicide process of the gate and source and drain regions described later, for example, nitrided silicon (SiN) film.

Further, by the ion implantation method once again As$^+$ ion is implanted into the region of NMOSFET under the conditions 600 KeV, $3 \times 10^{15}$ cm$^{-2}$, while BF$_2^+$ ion is implanted into the region of PMOSFET under the conditions 40 KeV, $5 \times 10^{14}$ cm$^{-2}$, thereby impurity diffused regions at high concentration are formed in a predetermined region where the source and drain regions are formed. These conditions are shown in FIG. 4. Then, heat treatment is carried out in nitrogenous (N$_2$) atmosphere at 950° C. for 30 seconds to activate impurities, thereby, LDD (lightly-doped drain) layer 151 directly under the side-wall insulating layer 14 is formed in depth 65 nm, while the high impurity diffused region 152 of the source and drain regions is formed in depth 180 nm.

Figure 3B:
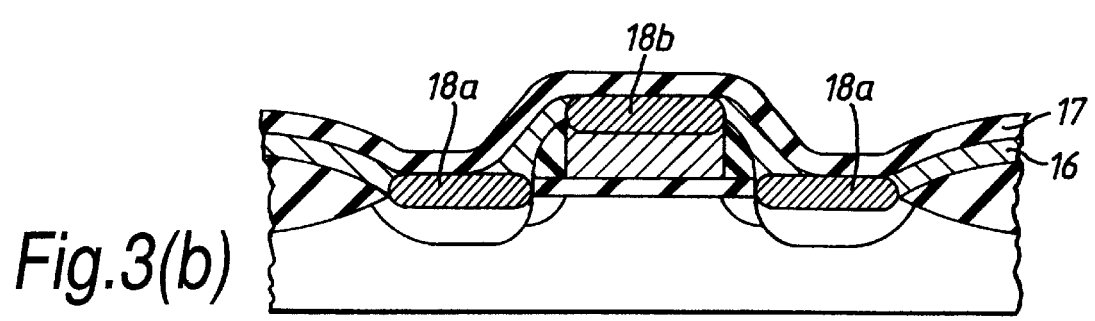
Figures 4, 5:
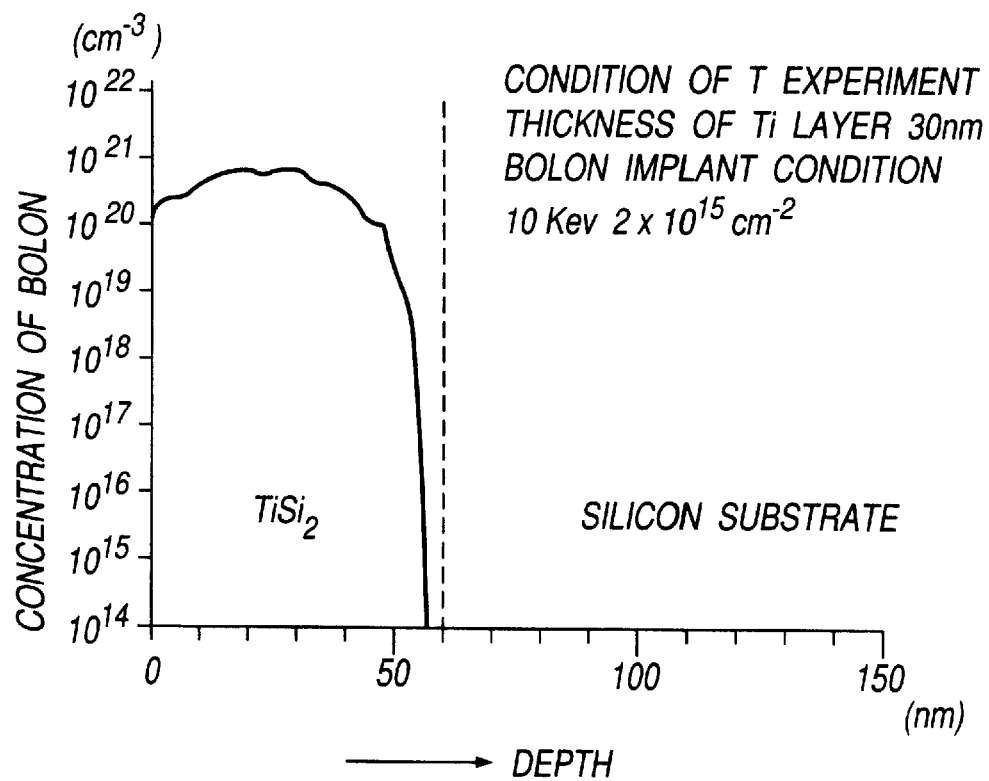
FIG. 4 is a diagram showing an example of the condition setting in the process in FIG. 3.
FIG. 5 is a diagram showing an example of boron depth distribution in boron implementation immediately after the formation of TiSi$_2$ film in the process in FIG. 3.

After the above, as shown in FIG. 3(b), Ti target is sputtered by use of Ar plasma, thereby metal titanium film (Ti film) 16 is accumulated 30 nm. Then, a cap film 17 comprising nitrided titanium (TiN) film is accumulated 70 nm so as to restrict the roughness of titanium silicide surface at the formation of titanium silicide described later. At this moment, normally, titanium target (metal titanium film) 16 is sputtered by use of plasma of mixture gas of argon and nitrogen, thereby nitriding reaction of titanium is induced on the titanium target surface, and TiN film 17 is accumulated on the abovementioned metal titanium film 16.

Heat treatment is carried out on the multi layer film formed as shown above, at 750° C. to 800° C. under nitrogenous atmosphere for 30 seconds, and titanium silicide ($TiSi_2$) films 18a and 18b are formed by solid phase reaction of titanium and silicon in the metal titanium film 16 on the source and drain regions and the gate electrode 13 contacting the metal titanium film 16.

Figure 3C:
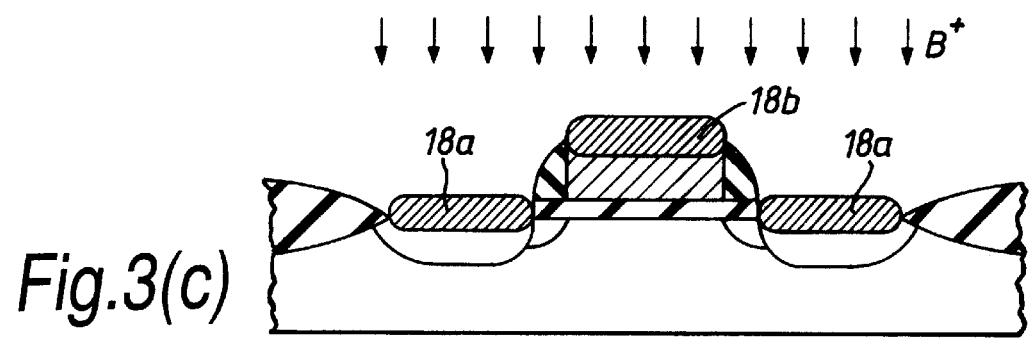
Figure 3D:
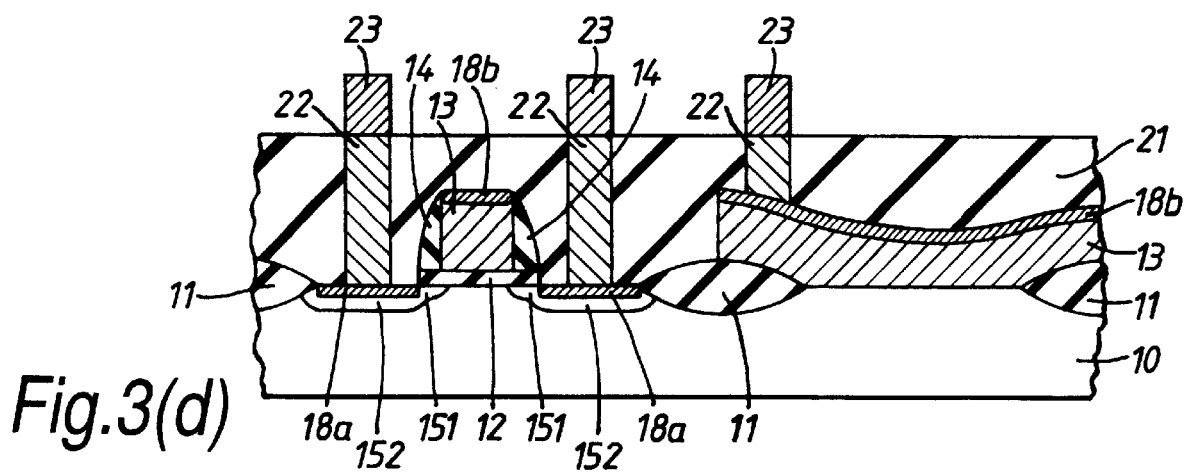

Then TiN film 17 and unreacted Ti film 16 are removed by etching by use of mixture solution of sulfuric acid and hydrogen peroxide, and then as shown in FIG. 3(c), boron (B) is added under the conditions 10 KeV, $2\times10^{15}$ $cm^{-2}$ by use of ion implantation method.

FIG. 5 shows an example of the depth distribution of boron obtained by the ion implantation under the above conditions, wherein boron stays in $TiSi_2$ films 18a and 18b, and does not thrust out substrate.

Through the optimization in this manner, the increase of the contact resistance with $TiSi_2$ film also on the diffused layer of N type MOSFET and on the gate electrode of N type MOSFET is avoided, therefore, the above process is completely compatible with CMOS technology.

Then, through heat treatment under nitrogenous atmosphere at temperature over 800° C. (preferably, about 850° C., they are changed completely into $TiSi_2$ films 18a and 18b having a C54 crystal structure that is stable at high temperatures. Also through this heat treatment, boron forms titanium boride in $TiSi_2$ films 18a and 18b and gets to exist stably.

According to the above process, $TiSi_2$ films 18a and 18b can be formed only on the high impurity diffused layer 152 of source and drain regions, and the gate electrode 13, however, $TiSi_2$ film may be formed only on the gate electrode 13, or only on the high impurity diffused layer 152.

After the above, interlayer insulating layer 21 is accumulated on the whole surface, and contact hole is opened, and a wiring line 23 of a first layer is arranged so that $TiSi_2$ films 18a and 18b are connected via a contact plug 22.

Figure 6:
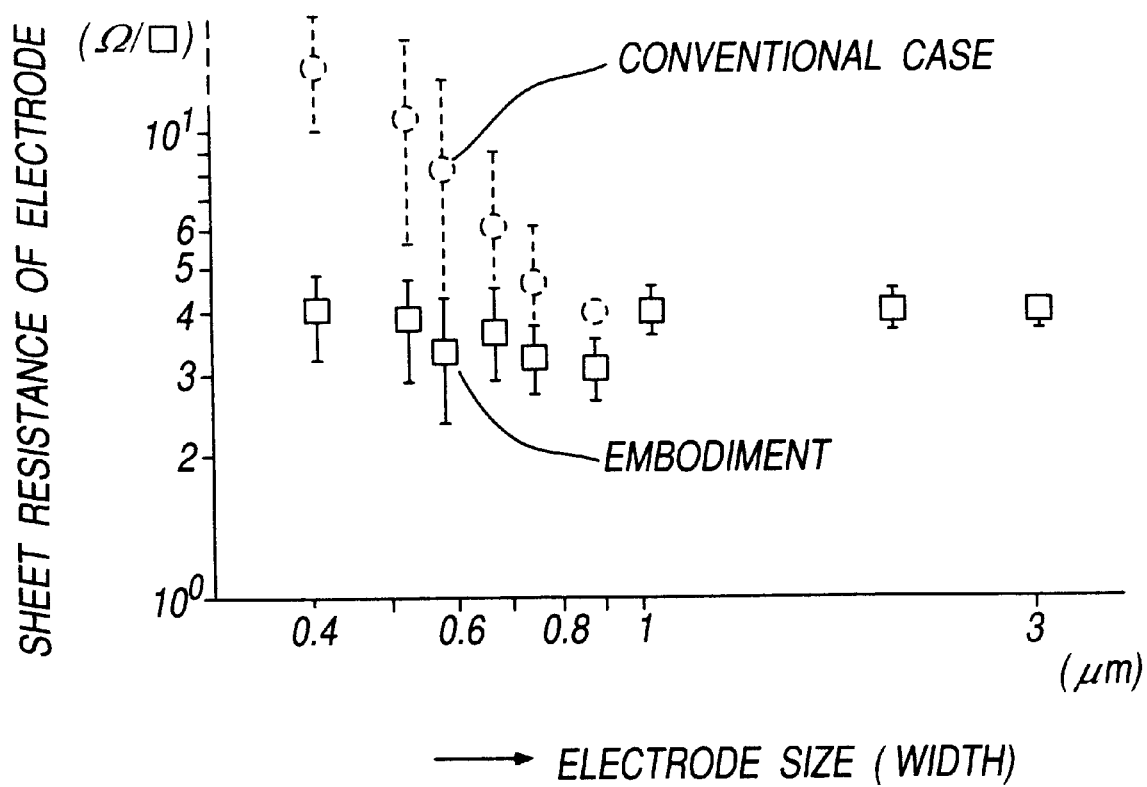
FIG. 6 is a diagram to compare the diffused layer width dependency of the sheet resistance of the metal chemical film formed by a semiconductor device formed by the manufacturing method in FIG. 3, and that formed by the conventional technology.

The solid line in the graph shown in FIG. 6 shows the measurement results of the diffused layer width dependency of the sheet resistance of $TiSi_2$ films 18a and 18b formed according to the above process. By the way, the dot line in the graph shown in FIG. 6 shows the diffused layer width dependency of the sheet resistance of $TiSi_2$ films 18a and 18b formed according to the prior art as for comparison.

The specific resistance of $TiSi_2$ films 18a and 18b formed according to the above process appears to be about 13 $\mu\Omega cm$ though the film thickness of $TiSi_2$ films 18a and 18b is as thin as 55 nm, thus it has been found that the specific resistance is extremely low as well as bulk value.

Moreover, in the prior art, the rapid increase of the specific resistance of diffused layer was observed at the width of diffused layer below 1 $\mu m$, on the other hand, in accordance with the above embodiment, even when the width of the high impurity diffused layer 152 was made to 0.4 $\mu m$, the specific resistance of $TiSi_2$ film formed on the high impurity diffused layer 152 could be made extremely low, therefore, the sheet resistance of diffused layer could be reduced to 3 $\Omega/\square$, that is, ⅓ of that in the case formed by the conventional art. As a result, $TiSi_2$ film formed in accordance with the above embodiment has enabled to overcome the defect in the prior art where increase of resistance was to be observed on micro regions.

Namely, according to the manufacturing method of a semiconductor device as mentioned above, salicide process is adopted so as to reduce the incidental resistance on an extremely thin diffused layer accompanying with high integration and high speed of CMOSFET. In this case, at the formation of $TiSi_2$ film as the metal chemical of the transition metal and the element configuring semiconductor substrate (silicon) formed on the diffused layer of NMOSFET and on that of PMOSFET respectively, as shown in FIG. 5, boron is implemented so that the concentration of boron in $TiSi_2$ film should be $1\times10^{19}$ $cm^{-3}$. And boron does not thrust out semiconductor substrate and added in only $TiSi_2$ film, facilitating thermally stable titanium boriding.

With respect to this point, it can be explained crystallographically as shown below. Namely, the solid phase reaction between the silicon atom and the transition metal in semiconductor substrate causes a phase transition.

Then, since there is a difference between the thermodynamic energy before solid phase reaction (free energy) and the thermodynamic energy after solid phase reaction (free energy), i.e., since the free energy after the reaction is smaller, the above phase transition becomes a heat generating reaction. Because $TiSi_2$ has a large interface energy, it receives thermal energy (the abovementioned temperature increase) and transforms in the direction where surface area becomes smaller. Therefore, the convexes and concaves on the surface of $TiSi_2$ film become larger, causing the increase of sheet resistance.

Therefore, the inventors of the present patent application have make the most of the fact that titanium boride is a thermodynamically stable chemical, and put a large amount of titanium boride in $TiSi_2$ to make the convexes and concaves on the surface of $TiSi_2$ film small, thereby succeeded in making the sheet resistance of $TiSi_2$ film small.

In this manner, the formation of boride of thermodynamically stable transition metal improves the aggregation resistance of $TiSi_2$ by heat treatment off post process, as a consequence, it is possible to realize low resistance of electrode irrespective of the size of reaction portion.

Thereby, even in the case where the region of reaction portion is of a micro fine shape, it is possible to restrict the resistance increase owing to the aggregation of transition metal chemical. For instance, even in the case when the film thickness of $TiSi_2$ film 9 is made as thin as below 55 nm and the width of the region of the diffused layer is made as fine as below 0.4 $\mu m$, it is possible to realize CMOSFET where the specific resistance of $TiSi_2$ film does not increase, and further the improvement and high speed of the driving power of CMOSFET can be attained.

Namely, the process in this case comprises a first step to accumulate transition metal onto a silicon semiconductor substrate, a second step to add boron into only the above transition metal by ion implantation so as for boron not to thrust out the silicon semiconductor substrate, a third step to form self aligned metal silicide on the electrode portion of MOSFET by solid phase reaction between the above transition metal and silicon through heat treatment, and a fourth step to remove unreacted metal in the above third step.

Embodiment 2

The second embodiment of the present invention is described in detail hereinafter with reference to FIGS. 7(a) throughout (e).

Figure 7A:
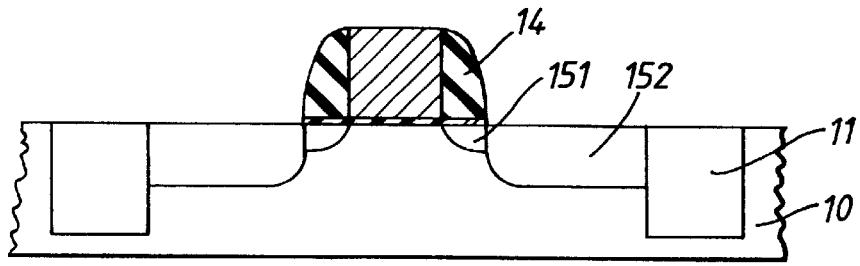
FIGS. 7(a)–7(e) are cross sectional diagrams showing an example of the process regarding embodiment 2 according to the present invention.

FIGS. 7(a) throughout (e) are schematic diagrams showing a process flow using salicide process in the formation of CMOSFET regarding an embodiment of the manufacturing method of a semiconductor device according to the present invention.

In the first place, as shown in FIG. 7(a), a separation region 11 is formed on a semiconductor substrate 10, and a gate electrode 13 (generally, non-dope polysilicon) is formed via a gate insulating film 12 on the partial surface of the element region.

In the next place, by the ion implantation method well known to those skilled in the art, $As^+$ ion is implanted into the region of NMOSFET under the conditions 30 KeV, $1\times10^{14}$ $cm^{-2}$, while $BF_2^+$ ion is implanted into the region of PMOSFET under the conditions 20 KeV, $1\times10^{14}$ $cm^{-2}$, thereby impurities are added to gate electrode 13 and LDD (lightly-doped drain) layer 151 for source region and drain region is formed on substrate surface portion in self aligned manner.

Then, in order to prevent short-circuit between the source region and the drain region and the gate electrode 13, a side-wall insulating layer 14 is formed on the side surface of the gate electrode by use of the known technology. Namely, the side-wall insulating layer 14 is formed by dry etching without using mask after accumulation of an insulating layer that does not react in the silicide process of the gate and source and drain regions described later, for example, nitrided silicon (SiN) film.

Further, by the ion implantation method once again $As^+$ ion is implanted into the region of NMOSFET under the conditions 60 KeV, $3\times10^{15}$ $cm^{-2}$, while $BF_2^{30}$ ion is implanted into the region of PMOSFET under the conditions 40 KeV, $5\times10^{14}$ $cm^{-2}$, thereby impurity diffused regions 152 at high concentration are formed in a predetermined region where the source and drain regions are formed. Then, heat treatment is carried out in nitrogenous ($N_2$) atmosphere at 950° C. for 30 seconds to activate impurities, thereby, LDD (lightly-doped drain) layer 151 is formed in depth 65 nm, while the high impurity diffused region 152 is formed in depth 180 nm.

Figure 7B:
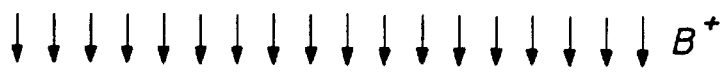
Figure 7B:
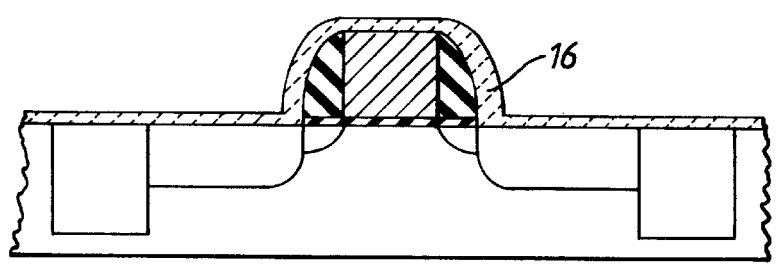
Figure 7C:
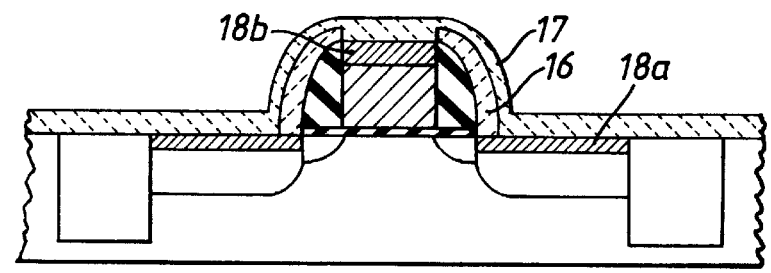
Figure 7D:
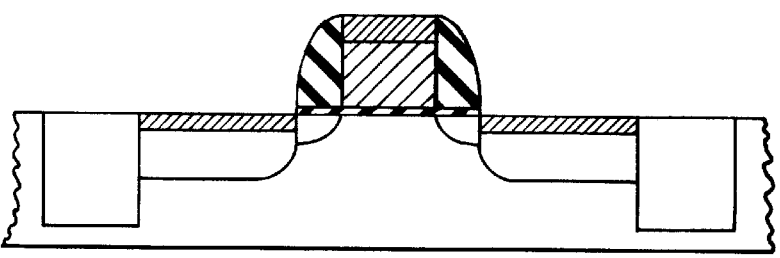

After the above, as shown in FIG. 7(d), Ti target is sputtered by use of Ar plasma, thereby metal titanium film (Ti film) 16 is accumulated 30 nm. Then, boron (B) is added under the conditions 10 KeV, $2\times10^{15}$ $cm^{-2}$ by use of ion implementation. In this case, even if nitrided titanium (TiN) is formed on surface, the principle of the present invention will not be changed at all.

Then, as shown in FIG. 7(c), heat treatment is carried out on the titanium film to which boron has been added, at 750° C. to 800° C. under nitrogenous atmosphere for 30 seconds, and titanium silicide ($TiSi_2$) film 18a and 18b are formed by solid phase reaction of titanium and silicon in the metal titanium film 16 on the source and drain regions and the gate electrode 13 contacting the metal titanium film 16. In the silicide film, boron added by ion implementation combines with titanium by the above annealing, and exists stably as titanium boride. And since litanium silicide consumes silicon and is formed on substrate side, even if boron should thrust out substrate by the above ion, boron is taken in all inside of silicide, accordingly, the increase of contact resistance with $TiSi_2$ film both on the diffused layer of N type MOSFET and the gate electrode of N type MOSFET is avoided, therefore, the above process is completely compatible with CMOS technology.

Then, as shown in FIG. 7(d), TiN film 17 and unreacted Ti film 16 are removed by etching by use of mixture solution of sulfuric acid and hydrogen peroxide.

Then, through heat treatment under nitrogenous atmosphere at temperature over 800° C. (preferably, about 850° C.), they are changed completely into TiSi films 18a and 18b having a C54 crystal structure that is stable at high temperatures.

According to the above process, $TiSi_2$ films 18a and 18b can be formed only on the high impurity diffused layer 152 of source and drain regions, and the gate electrode 13, however, $TiSi_2$ film may be formed only on the gate electrode 13, or only on the high impurity diffused layer 152.

Figure 7E:
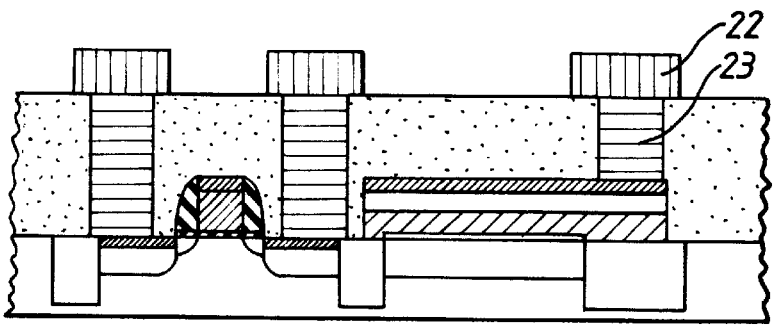

After the above, as shown in FIG. 7(e), interlayer insulating layer 21 is accumulated on the whole surface, and contact hole is opened, and a wiring line 23 of a first layer is arranged so that $TiSi_2$ films 18a and 18b are connected via a contact plug 22.

According to the method described above, with respect to the boron-added silicide film as well as the silicide film shown in the previous embodiment 1, the formation of boride of thermodynamically stable transition metal improves the aggregation resistance of $TiSi_2$ by heat treatment of post process, as a consequence, it is possible to realize low resistance of electrode irrespective of the size of reaction portion.

Embodiment 3

In the next place, the third embodiment of the present invention is described in detail hereinafter with reference to FIGS. 8(a) throughout (d).

Figure 8A:
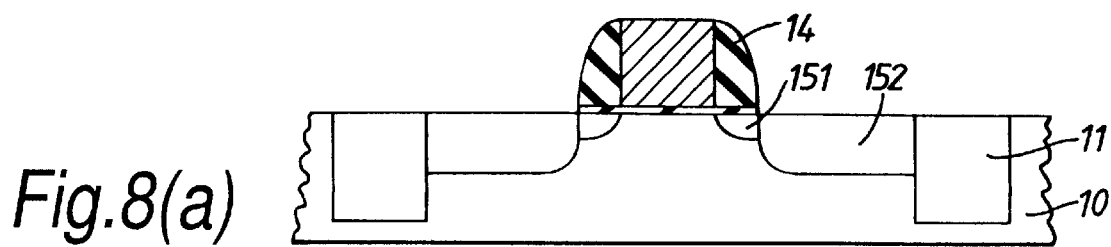
FIGS. 8(a)–8(d) are cross sectional diagrams showing an example of the process regarding embodiment 3 according to the present invention.

FIGS. 8(a) throughout (d) are schematic diagrams showing a process flow using salicide process in the formation of CMOSFET regarding an embodiment of the manufacturing method of a semiconductor device according to the present invention.

In the first place, as shown in FIG. 8(a), a separation region 11 is formed on a semiconductor substrate 10, and a gate electrode 13 (generally, non-dope polysilicon) is formed via a gate insulating film 12 on the partial surface of the element region.

In the next place, by the ion implantation method well known to those skilled in the art, $As^+$ ion is implanted into the region of NMOSFET under the conditions 30 KeV, $1\times10^{14}$ $cm^{-2}$, while $BF_2^+$ ion is implanted into the region of PMOSFET under the conditions 20 KeV, $1\times10^{14}$ $cm^{-2}$, thereby impurities are added to gate electrode 13 and LDD (lightly-doped drain) layer 151 for source region and drain region is formed on substrate surface portion in self aligned manner.

Then, in order to prevent short-circuit between the source region and the drain region and the gate electrode 13, a side-wall insulating layer 14 is formed on the side surface of the gate electrode by use of the known technology. Namely, the side-wall insulating layer 14 is formed by dry etching without using mask after accumulation of an insulating layer that does not react in the silicide process of the gate and source and drain regions described later, foe example, nitrided silicon (SiN) film.

Further, by the ion implantation method once again $As^+$ ion is implemented into the region of NMOSFET under the conditions 60 KeV, $3\times10^{15}$ $cm^{-2}$, while $BF_2+$ ion is implanted into the region of PMOSFET under the conditions 40 KeV, $5\times10^{14}$ $cm^{-2}$, thereby impurity diffused regions 152 at high concentration are formed in a predetermined region where the source and drain regions are formed. Then, heat treatment is carried out in nitrogenous ($N_2$) atmosphere at 950° C. for 30 seconds to activate impurities, thereby, LDD (lightly-doped drain) layer 151 is formed in depth 65 nm, while the high impurity diffused region 152 is formed in depth 180 nm.

Figure 8B:
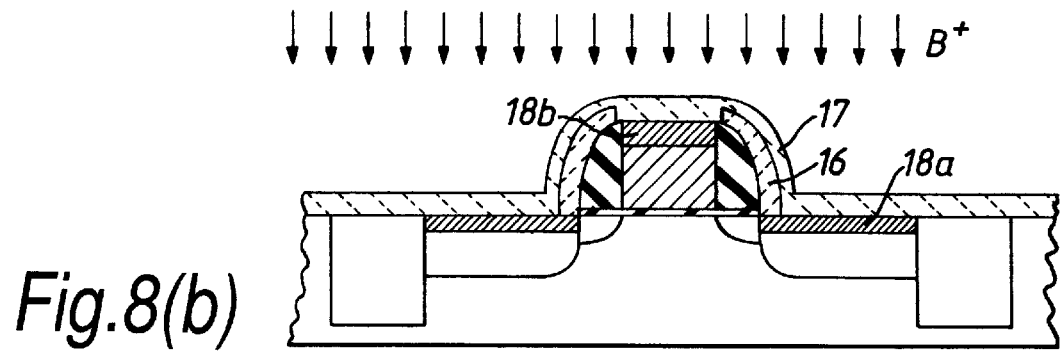
Figure 8C:
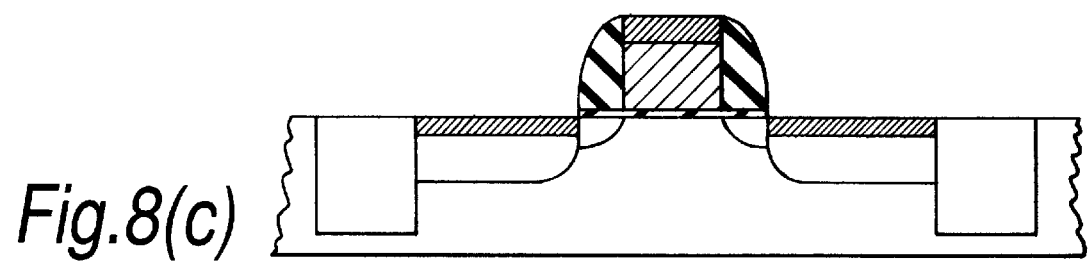
Figure 8D:
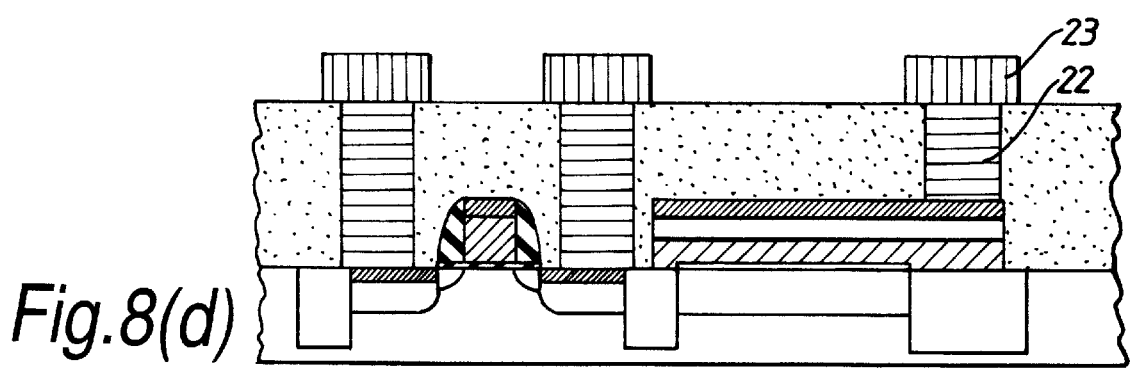

After the above, as shown in FIG. 8(b), Ti target is sputtered by use of Ar plasma, thereby metal titanium film (Ti film) 16 is accumulated 30 nm.

Then, heat treatment is carried out at 750° C. to 800° C. under nitrogenous atmosphere for 30 seconds, and titanium silicide (TiSi$_2$) film 18a and 18b are formed by solid phase reaction of titanium and silicon in the metal titanium film 16 on the source and drain regions and the gate electrode 13 contacting the metal titanium film 16.

Next, boron (B) is added under the conditions 10 KeV, $2\times10^{15}$ cm$^{-2}$ by use of ion implementation.

Then, as shown in FIG. 8(a), TiN film 17 and unreacted Ti film 16 are removed by etching by use of mixture solution of sulfuric acid and hydrogen peroxide.

Then, through heat treatment under nitrogenous atmosphere at temperature over 800° C. (preferably, about 850°C.), they are changed completely into TiSi films 18a and 18b having a C54 crystal structure that is stable at high temperatures.

In the silicide film, boron added by ion implementation combines with titanium by the above annealing, and exists stably as titan boride.

According to the above process, TiSi$_2$ films 18a and 18b can be formed only on the high impurity diffused layer 152 of source and drain regions, and the gate electrode 13, however, TiSi$_2$ film may be formed only on the gate electrode 13, or only on the high impurity diffused layer 152.

According to the method described above, with respect to the boron-added silicide film as well as the silicide film shown in the previous embodiment 1, the formation of boride of thermodynamically stable transition metal improves the aggregation resistance of TiSi$_2$ by heat treatment of post process, as a consequence, it is possible to realize low resistance of electrode irrespective of the size of reaction portion.

Embodiment 4

In the next place, the fourth embodiment of the present invention is described in detail hereinafter with reference to FIGS. 9(a) throughout (d).

Figure 9A:
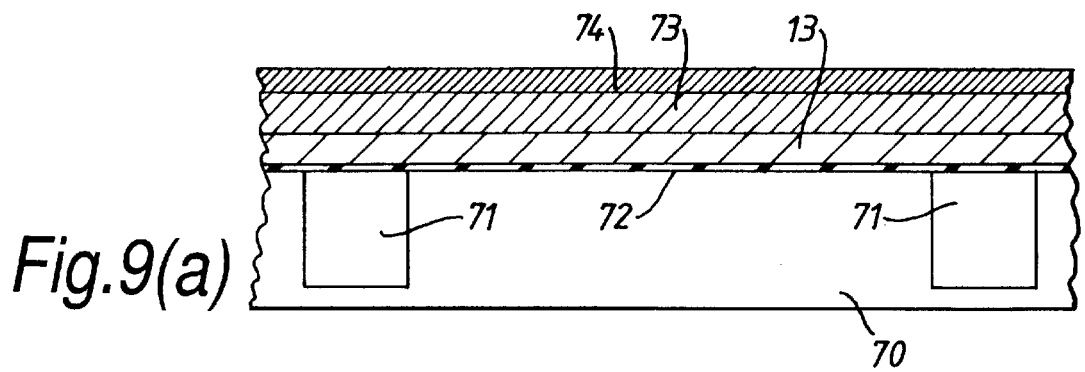
FIGS. 9(a)–9(d) are cross sectional diagrams showing an example of the process regarding embodiment 4 according to the present invention.
Figure 9B:
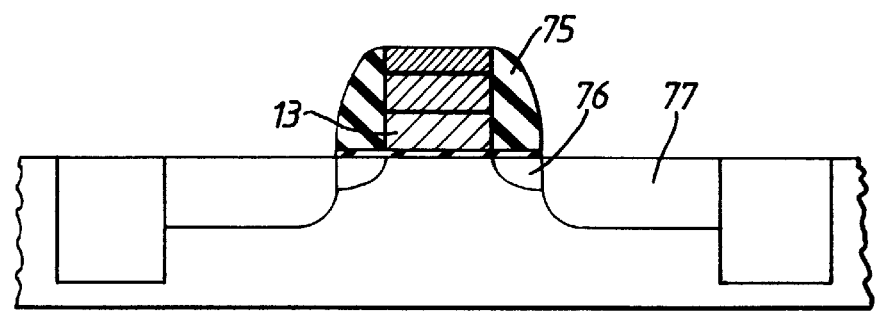
Figure 9C:
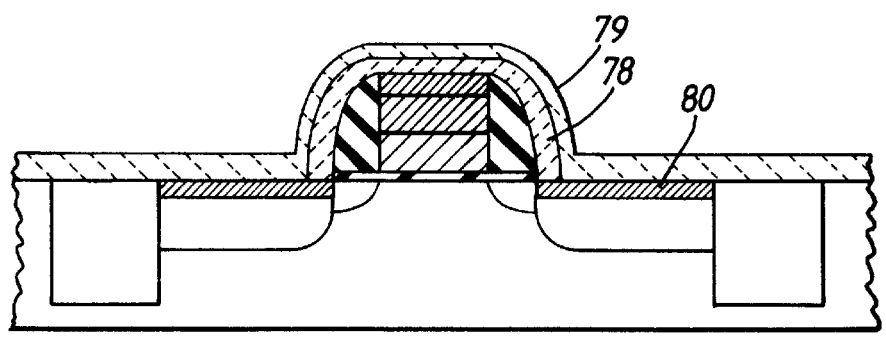

FIGS. 9(a) throughout (d) are schematic diagrams showing a process flow using salicide process where to attach silicide only to the source and drain electrode in self aligned manner in the formation of CMOSFET regarding an embodiment of the manufacturing method of a semiconductor device according to the present invention.

In the first place, as shown in FIG. 9(a), a separation region 71 is formed on a semiconductor substrate 70, and impurity ion implementation is carried out and a well is formed by diffusion, and a polysilicon film 13' (generally, non-dope polysilicon) is formed via a gate insulating film 72 on the partial surface of the element region.

In the next place, by the ion implantation method well known to those skilled in the art, As$^+$ ion is implanted under the conditions 30 KeV, $1\times10^{15}$ cm$^{-2}$, while BF$_2^+$ ion is implanted under the conditions 20 KeV, $1\times10^{15}$ cm$^{-2}$ respectively, thereby impurities are added to the polysilicon film 13'. Then, a metal film 73 comprising tungsten silicide is accumulated by PVD such as sputtering or CVD, and insulation film is accumulated directly on it. By the way, the above metal film 73 may be titanium silicide or cobalt silicide. And a gate protection film 74 is accumulated directly on it.

Then, as shown in FIG. 7(b), patterning is carried out on a gate electrode by lithography technology, and the gate protection film 74, the metal film 73, and the polysilicon film 13' are processed by reactive etching (RIE), and thereby a gate electrode 13 is formed Following the above, by the ion implantation method, As$^+$ ion is implanted into the region of NMOSFET under the conditions 35 KeV, $1\times10^{14}$ cm$^{-2}$, while BF$_2^+$ ion is implanted into the region of PMOSFET under the conditions 20 KeV, $1\times10^{14}$ cm$^{-2}$, thereby the known LDD (lightly-doped drain) layer 76 is formed, and after this, the side-wall insulating layer 75 is formed by the known technology on the side surface of the gate electrode for the purpose of preventing the short-circuit between the source region and drain region and the gate electrode 13. Namely, the side-wall insulating layer 75 is formed by dry etching without using mask after accumulation of an insulating layer that does not react in the silicide process or the gate and source and drain regions described later, foe example, nitrided silicon (SiN) film.

Further, with regard to substrate surface portion, by the ion implantation method, As$^+$ ion is implemented into the region of NMOSFET under the conditions 60 KeV, $3\times10^{15}$ cm$^{-2}$, while BF$_2^+$ ion is implanted into the region of PMOSFET under the conditions 40 KeV, $5\times10^{14}$ cm$^{-2}$, thereby impurity diffused regions 77 at high concentration are formed in a predetermined region where the source and drain regions are formed. Then, heat treatment is carried out in nitrogenous (N$_2$) atmosphere at 950° C. for 30 seconds to activate impurities, thereby, LDD (lightly-doped drain) layer 76 is formed in depth 65 nm, while the high impurity diffused region 77 is formed in depth 180 nm.

After the above, as shown in FIG. 9(a), Ti target is sputtered by use of Ar plasma, thereby metal titanium film (Ti film) 78 is accumulated 30 nm. Following this, a cap film 79 comprising nitrided titanium (TiN) film is accumulated 70 nm so as to restrict the roughness of titanium silicide surface at the formation of titanium silicide described later. At this moment, normally, titanium target (metal titanium film) 16 is sputtered by use of plasma of mixture gas of argon and nitrogen, thereby nitriding reaction of titanium is induced on the titanium target surface, and TiN film 79 is accumulated on the abovementioned metal titanium film 78.

Heat treatment is carried out on the multi layer film formed as shown above, at 750° C. to 800° C. under nitrogenous atmosphere for 30 seconds, and titanium silicide (TiSi$_2$) film 80 is formed by solid phase reaction of titanium and silicon in the metal titanium film 78 on the source and drain regions contacting the metal titanium film 78.

Figure 9D:
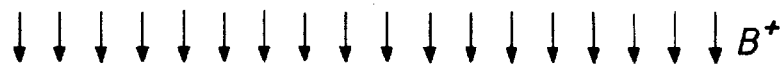

Then, as shown in FIG. 9(d), TiN film 79 and unreacted Ti film 78 are removed by etching by use of mixture solution of sulfuric acid and hydrogen peroxide, and then, boron (B) is added under the conditions 10 KeV, $2\times10^{15}$ cm$^{-2}$ by use of ion implementation method.

FIG. 5 shows an example of the depth distribution of boron obtained by the ion implementation under the above conditions, wherein boron stays in TiSi$_2$ film 80, and does not thrust out substrate.

Through the optimization in this manner, the increase of the contact resistance with TiSi$_2$ film also on the diffused layer of N type MOSFET and on the gate electrode of N type MOSFET is avoided, therefore, the above process is completely compatible with CMOS technology.

Then, through heat treatment under nitrogenous atmosphere at temperature over 800° C. (preferably, about 850° C.), it is changed completely into TiSi film 80 having a C54 crystal structure that is stable at high temperatures. Also through this heat treatment, boron forms titan boride in TiSi$_2$ film 80 and gets to exist stably.

According to the above process, TiSi$_2$ film 80 can be formed on the high impurity diffused layer 77 of source and drain regions.

After the above, interlayer insulating layer is accumulated on the whole surface, and contact hole is opened, and a wiring line of a first layer is arranged so as to connect TiSi$_2$ film 80 via a contact plug.

The specific resistance of TiSi$_2$ film 80 formed according to the above process appears to be about 13 $\mu\Omega$cm though the film thickness of TiSi$_2$ film 80 is as thin as 55 nm, thus it has been found that the specific resistance is extremely low as well as bulk value.

Moreover, in the prior art, the rapid increase of the specific resistance of diffused layer was observed at the width of diffused layer below 1 $\mu$m, on the other hand, in accordance with the above embodiment, even when the width of the high impurity diffused layer 152 was made to 0.4 $\mu$m, the specific resistance of TiSi$_2$ film formed on the high impurity diffused layer 77 could be made extremely low, therefore, the sheet resistance of diffused layer could be reduced to 3 $\Omega/\square$, that is, ⅓ of that in the case formed by the conventional art. As a result, TiSi$_2$ film formed in accordance with the above embodiment has enabled to overcome the defect in the prior art where increase of resistance was to be observed on micro regions.

Namely, according to the manufacturing method of a semiconductor device as mentioned above, salicide process is adopted so as to reduce the incidental resistance on an extremely thin diffused layer accompanying with high integration and high speed of CMOSFET. In this case, at the formation of TiSi$_2$ film as the metal chemical of the transition metal and the element configuring semiconductor substrate (silicon) formed on the diffused layer of NMOSFET and on that of PMOSFET respectively, as shown in FIG. 5, boron is implemented so that the concentration of boron in TiSi$_2$ film should be $1 \times 10^{19}$ cm$^{-3}$. And boron does not thrust out semiconductor substrate and added in only TiSi$_2$ film, facilitating thermally stable titanium boriding.

By the way, in the embodiment mentioned above, when a metal silicide is formed in self aligned manner on silicon substrate by accumulating transition metal and by the solid phase reaction of transition metal and silicon, metal silicide is formed in self aligned manner on the electrode portion by heat treatment immediately after accumulating transition metal, and unreacted metal is removed, then boron is added only into metal silicide by ion implementation with boron not thrusting out semiconductor substrate, however, the order of processes may be changed as shown in the following (1) and (2);

(1) Immediately after a metal chemical is formed in self aligned manner on the electrode portion just after accumulation of transition metal (immediately before the removal of unreacted metal), boron may be added into only metal silicide by ion implementation with boron not thrusting out semiconductor substrate.

Namely, the process in this case comprises a first step to form metal silicide in self aligned manner an the electrode portion of MOSFET by the solid phase reaction of transition metal and silicon by heat treatment by accumulating transition metal on a silicon semiconductor substrate, and a second step to add boron into only the above metal silicide so that boron should not thrust out the silicon semiconductor substrate by ion implementation, and a third step to remove unreacted metal in the above first step.

(2) Immediately after accumulation of transition metal, boron may be added into only transition metal by ion implementation so that boron should not thrust out the semiconductor substrate so as for the final concentration to become as shown in the figure.

Namely, the process in this case comprises a first step to accumulate transition metal onto a silicon semiconductor substrate, a second step to add boron into only the above transaction metal by ion implementation so as for boron not to thrust out the silicon semiconductor substrate, a third step to form self aligned metal silicide on the electrode portion of MOSFET by solid phase reaction between the above transition metal and silicon through heat treatment, and a fourth step to remove unreacted metal in the above third step.

Embodiment 5

The embodiments described heretofore are concerned with CMOSFET, however, the present invention may be applied to not only CMOSFET but also silicide attachment to the electrode of transistor base resistance.

Figure 10A:
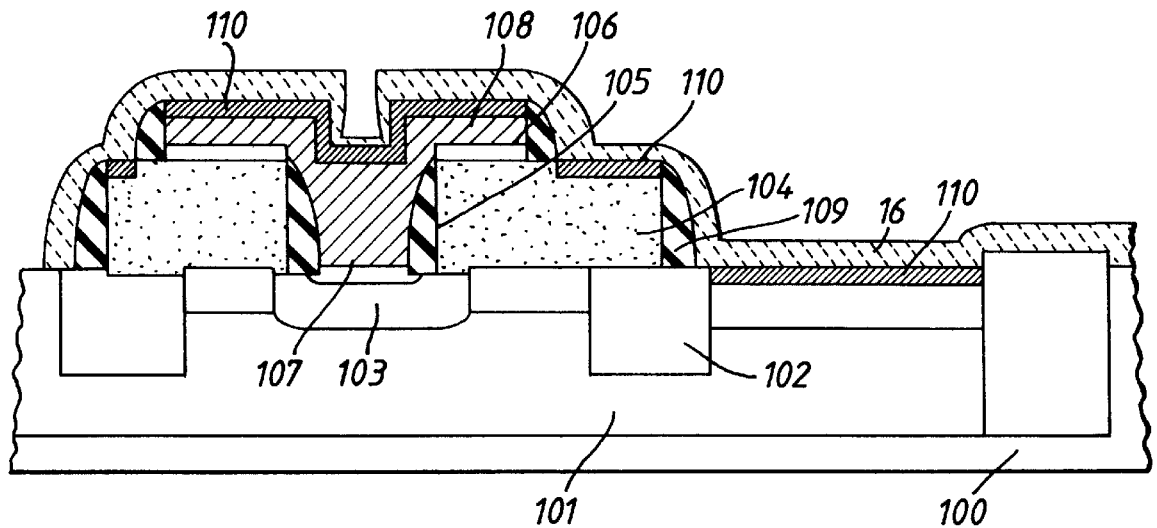
FIGS. 10(a), 10(b) are cross sectional diagrams showing an example of the process regarding embodiment 5 according to the present invention.
Figure 10B:
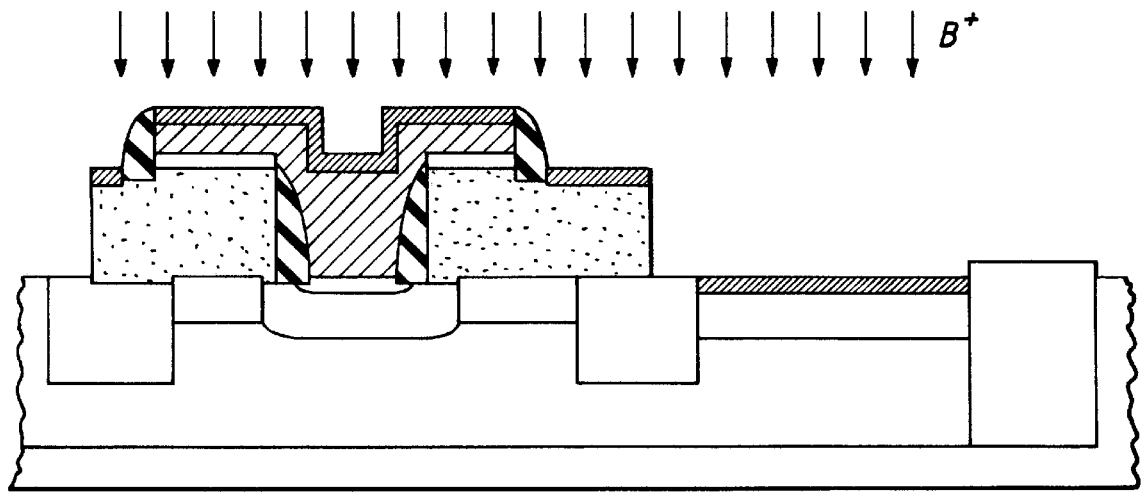

FIG. 10(*a*) shows a salicide process to a bipolar transistor base resistance by a known method, First, a separation region 102 and a N-well 101 are formed on a semiconductor substrate 100. An insulating film is formed on the N-well 101, and the insulating film at the portion where a base electrode is formed is removed so that the surface of the semiconductor substrate 100 should be exposed. A base electrode 103 is formed on this removed portion by epitaxial growth.

In the next place, a polysilicon film is formed on the whole surface of the semiconductor substrate 101, and the polysilicon film at the emitter region forming portion in the base electrode 103 is removed. Thereby, a base drawer electrode 104 is formed. Then, an insulation film is formed on the side surface and the front surface of this base drawer electrode 104 is formed. Anisotropic etching is carried out on this insulating film so that part of this insulating film should be left on the side surface of the base drawer electrode 104. In this manner, a first insulating film side wall 105 is formed.

Following the above, an insulating film 106 is formed on the surface of the base drawer electrode 104. Polysilicon is accumulated on the slot just above the base electrode 103, from which an emitter electrode 107 is formed by ion implantation process. Then, an emitter drawer electrode 108 comprising polysilicon is formed on the surface of the insulating film 106.

Then, a second insulating film side wall 109 is formed, and a metal titanium film is accumulated on the whole surface, and a rapid thermal annealing (RTA) is carried out at 700° C. to 800° C. in nitrogenous atmosphere. Thereby, titanium silicide (TiSi$_2$) film 110 is formed by solid phase reaction of titanium and silicon in the metal titanium film on the emitter electrode 107, the base drawer electrode 104, and the surface of the semiconductor substrate 101 to become a collector drawer electrode contacting the metal titanium film 16.

Then TiN film and unreacted metal titanium film are removed by etching by use of mixture solution of sulfuric acid and hydrogen peroxide, and then boron (B) is added under the conditions 10 KeV, $2 \times 10^{15}$ cm$^{-2}$ by use of ion implementation method.

Then, through heat treatment under nitrogenous atmosphere at temperature over 800° C. (preferably, about 850° C.), it is changed completely into TiSi film 110 having a C54 crystal structure that is stable at high temperatures. Also through this heat treatment, boron forms titan boride in TiSi$_2$ film 110 and gets to exist stably.

According to the above process, as shown in FIG. 10(*b*), TiSi$_2$ film 110 can be formed on the emitter drawer electrode 107, the base drawer electrode 104, and the surface of the semiconductor substrate to become a collector drawer substrate 101.

After the above, interlayer insulating layer is accumulated on the whole surface, and contact hole is opened, and a wiring line of a first layer is arranged so that TiSi$_2$ film 110 is connected via a contact plug.

The specific resistance of TiSi$_2$ film 110 formed according to the above process appears to be about 13 $\mu\Omega$cm though the film thickness of TiSi$_2$ film is as thin as 55 nm, thus it has been found that the specific resistance is extremely low as well as bulk value.

According to the present invention mentioned heretofore, it is possible to provide a semiconductor device and a method of manufacturing the same that enable to prevent transition metal chemical from aggregating owing to heat process and resistance from increasing even if the region of reaction portion is of a micro fine shape in the case to apply salicide process to the formation of CMOSFET.

While there has been illustrated and described what are presently considered to be preferred embodiments of the present invention, it will be understood by those skilled in the art that various changes and modifications may be made, and equivalents may be substituted for devices thereof without departing from the true scope of the invention. In addition many modifications may be made to adapt a particular situation or material to the teaching of the present invention without departing from the central scope thereof. Therefore, it is intended that this invention not be limited to the particular embodiment disclosed as the best mode contemplated for carrying out this invention, but that the invention include all embodiments falling within the scope of the appended claims.

What is claimed is:

1. An NMOS transistor, comprising:
    a semiconductor substrate;
    a drain region and a source region in the semiconductor substrate; and
    a metal silicide layer on the source region and the drain region including boron, wherein the boron is implanted above the source region and the drain region only into the metal silicide layer.

2. The NMOS transistor according to claim 1, wherein a width of the metal silicide is 0.4 $\mu$m or below, and a thickness thereof is 55 nm or below.

3. The NMOS transistor according to claim 1, further comprising:
    a gate above the semiconductor substrate; and
    a metal silicide layer on the gate electrode.

4. The NMOS transistor according to claim 1, wherein the metal silicide layer comprises metal boride.

5. The NMOS transistor according to claim 1, wherein the metal silicide layer comprises a predetermined amount of metal boride to prevent metal silicide aggregation.

6. The NMOS transistor according to claim 5, wherein the metal silicide layer comprises titanium silicide with a predetermined concentration of titanium boride to prevent thermal aggregation during a heat treatment at a temperature over 800° C. to change titanium silicide into titanium silicide having a C54 crystal structure.

7. The NMOS transistor according to claim 1, wherein the boron is present within the metal silicide layer in a distribution having a peak concentration spaced away from an interface between the metal silicide layer and the semiconductor substrate.

* * * * *